United States Patent [19]

Hoare et al.

[11] 3,753,807

[45] Aug. 21, 1973

[54] MANUFACTURE OF BIPOLAR SEMICONDUCTOR DEVICES

[75] Inventors: Raymond Alan Hoare; Kenneth George McQuhae, both of Ottawa, Ontario, Canada

[73] Assignee: Bell Canada-Northern Electric Research Limited, Ottawa, Ontario, Canada

[22] Filed: Feb. 24, 1972

[21] Appl. No.: 228,909

[52] U.S. Cl. .................... 148/188, 148/187, 29/574, 148/1.5

[51] Int. Cl. ............................ H01l 7/36, H01l 7/54

[58] Field of Search .................... 148/188, 1.5, 187; 29/574

[56] References Cited

UNITED STATES PATENTS

| | | | |
|---|---|---|---|
| 3,460,007 | 8/1969 | Scott | 317/235 |
| 3,590,471 | 7/1971 | Lepselter | 148/1.5 X |
| 3,592,707 | 7/1971 | Jaccodine | 148/187 X |
| 3,664,896 | 5/1972 | Duncan | 148/187 |
| 3,676,230 | 7/1972 | Rice | 148/188 X |

*Primary Examiner*—G. T. Ozaki
*Attorney*—Sidney T. Jelly

[57] ABSTRACT

A method of making bipolar semiconductors in which the base contact regions and the emitter region are defined by one masking step. A layer of polycrystalline silicon is formed on a substrate, the polycrystalline layer being removed at the positions for the base contact regions and the emitter produced beneath the remaining part of the layer by diffusion from the polycrystalline silicon which has been doped with a suitable emitter region dopant.

5 Claims, 8 Drawing Figures

MANUFACTURE OF BIPOLAR SEMICONDUCTOR DEVICES

This invention relates to the manufacture of bipolar semiconductor devices.

In the manufacture of bipolar devices, for example transistors, it is well known that the lateral clearance between the base contact diffusions and the emitter diffusion of a planar bipolar transistor should be minimized to ensure as low a base resistance as possible. In conventional technology the areas to be diffused are defined by two separate photomasking steps and a third photomasking step is required to make "contact windows" in the protective oxide layer through which ohmic contact must be made to the diffused regions.

The small errors in positioning inherent in mask alignment limit the minimum clearance between the base contact and emitter diffusions. The clearance between these two regions is made larger than desired to ensure that the two regions do not overlap and that the subsequent metallization does not cause an electrical short circuit between the emitter and the base.

The present invention provides a method for the manufacture of a bipolar semiconductor device, such as a transistor, in which the regions for base contact diffusion and the emitter are defined by the same photomasking operation, and to achieve lateral separation of the two regions by a simple etching step. Also it is possible to produce contact windows to the base of the transistor by using existing parts of the structure as a mask, thus eliminating a further critical photomask alignment step. A further feature of the invention is the extension of the "washed emitter" technique to any dopant species, and another feature is the provision of a method of making ohmic contact to the emitter whilst eliminating the possibility of "shorting out" shallow diffused layers.

The above, and other, advantages and improvements will be appreciated from the following description of an embodiment of the invention by way of example, and modifications thereof, in conjunction with the accompanying drawings which illustrate in sequence various steps in the manufacture of an n-p-n bipolar transistor, the figures being diagrammatic cross-sections.

Figure 1:
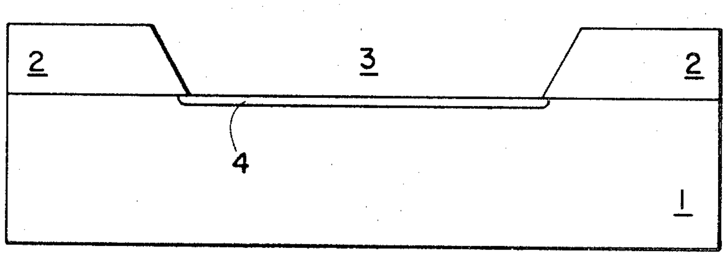

As seen in FIG. 1, an n-type substrate (or epitaxial layer) 1 has a layer of silicon dioxide 2 formed thereon. The layer 2 is conveniently formed by thermal oxidation after which conventional photolithographic techniques are used to define a window area. The window 3 is formed by etching down to the substrate 1. A predetermined quantity of a p-type impurity suitable for a base region —for example boron— is then placed in a very shallow surface layer 4, for example by a predeposition diffusion or by ion implantation.

A layer of polycrystalline silicon 5 doped with an n-type dopant, for example arsenic, is formed on the entire surface of the wafer, including the "window" 3. Layer 5 may be formed by evaporation, sputtering or chemical vapour deposition and the layer may be doped simultaneously with its formation or doped subsequently. A layer of silicon nitride 6 is formed over the entire polycrystalline silicon surface, again by any one of a variety of techniques. Silicon nitride is a particularly convenient material as it is a good masking material, accepts photo-resist, is removed only by selected etchants and has other advantages, although other materials having these properties can be used.

Figure 2:
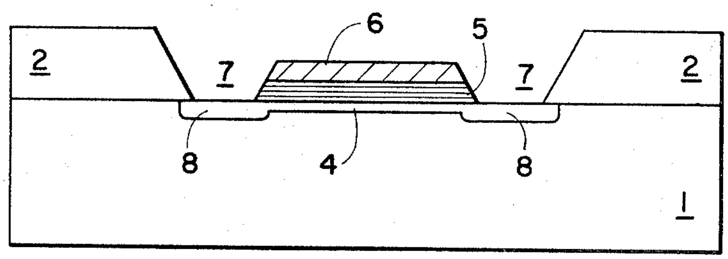

Using photolithographic techniques an area of the layer 6 is protected, the remainder removed by etching. The remaining area of layer 6 is then used to protect an area of the polycrystalline layer 5 while the remainder of layer 5 is etched away, leaving the substrate 1 exposed in areas 7. A predetermined amount of p-type dopant suitable for a base contact region —for example boron— is then placed in shallow surface areas 8 in the substrate 1 through the "window" areas 7, either by "predeposition" diffusion or by ion implantation. The resulting formation is as in FIG. 2.

Figure 3:
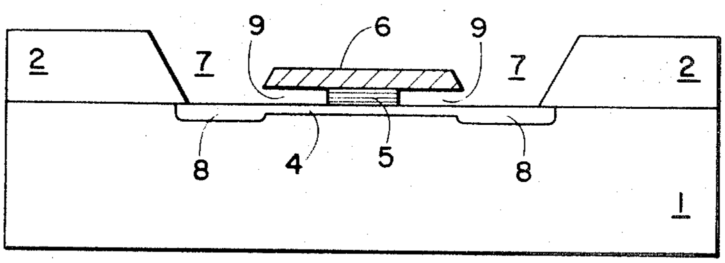
Figure 4:
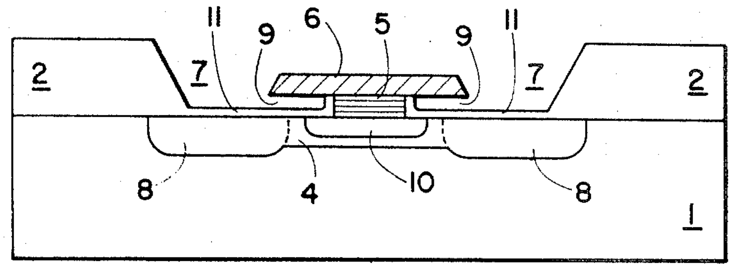

The polycrystalline layer 5 is further etched to remove material from the regions 9, undercutting the layer 6. This is illustrated in FIG. 3. Following the undercutting etch, the device is heat treated to produce a redistribution of the impurities or dopants. This enlarges the p-type regions 4 and 8 and at the same time creates the n-type emitter region 10 by diffusion from the polycrystalline silicon layer 5. Simultaneously the exposed silicon surface is oxidized to form oxide layer 11 in the regions 7 and 9. The structure at this stage is as illustrated in FIG. 4.

Figure 5:
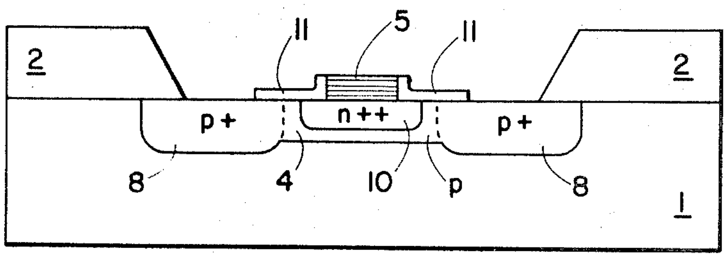
Figure 6:
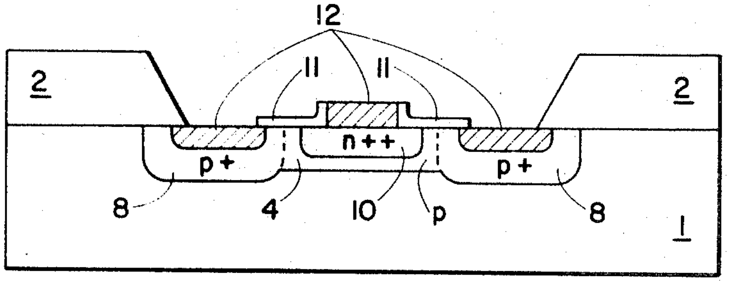

The oxide layer 11 is removed by sputter etching from the regions 7, the oxide layer in the regions 9 being protected from the sputtering ions by the overhanging layer 6. After completion of sputter etching the layer 6 is removed by chemical etching, the structure being as in FIG. 5. A layer of silicide forming metal, such as platinum is formed over the entire surface and heat treated to form a silicide 12 in any region where silicon is directly exposed to the metal. Excess metal is removed by chemical etching, finishing in the form illustrated in FIG. 6.

Figure 7:
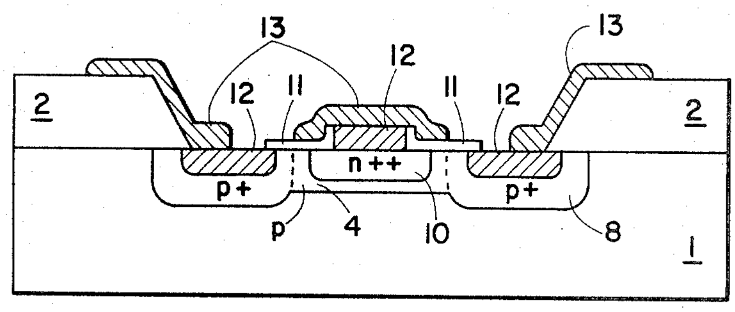
Figure 8:
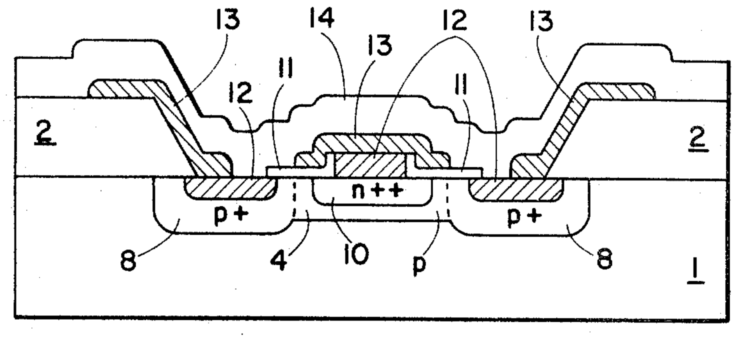

A layer of a metallic conductor, for example gold, is deposited over the surface and after masking by photolithography techniques to form the regions 13, the remainder of the layer is removed by etching. This is illustrated in FIG. 7. Finally if desired or necessary, a protective layer 14, such as silicon dioxide, is formed over the transistor, the final complete structure as in FIG. 8.

It will be seen that the initial photolithic masking of the layer 6 determines the relative positions of the base contact diffusion regions and of the eventually formed emitter region. Thus one masking step positions these various regions and immediately has alleviated the difficulty which arises in conventional techniques so far used in which separate masking steps are used for the base contact regions and emitter region.

The edge-etching of the polycrystalline silicon layer 5 to undercut the layer 6 is capable of very accurate control and thus the emitter region eventually produced by diffusion from the polycrystalline silicon layer can be accurately dimensioned and the separation between the emitter region, (10 in FIG. 8), and the base contact diffusions (8 in FIG. 8) can be accurately controlled and reduced to a dimension smaller than hitherto.

The overhanging layer 6, as in FIG. 4, also acts as a mask for the sputter etching of the contact windows through the oxide layer 11. Thus the positioning of these "base contact windows" relative to the emitter region is again capable of accurate control as the relative position between the masking layer 6 and the emitter region is determined by the initial etching step.

Removal of the layer 6 is in effect an extension of the "washed emitter" technique. Previously the emitter was uncovered by the etching away of a window in an oxide surface formed over the whole device. The emitter region of the oxide layer was doped with phosphorous —during the formation of an n-type emitter- and thereafter the window was formed as a result of preferential etching of the doped oxide area relative to the undoped areas. In the present invention the layer 6 is not restricted to phosphorous doping and a material can be selected for this layer which is completely different from the adjacent oxide and not affected by the specific impurity species being used.

In conventional techniques, an alloying step is provided after deposition of a conducting metal layer on the emitter. The alloying is to ensure good ohmic contact, with a portion of the diffused emitter region becoming alloyed. A typical contact metal is aluminum and it is a feature of the alloying step that the aluminum will diffuse laterally along the joint between the oxide layer and substrate. It is possible for such lateral diffusion, to cause an electrical short circuit. Similarly when a platinum silicide surface layer is formed, lateral diffusion can occur and cause difficulties. In the present invention the use of the polycrystalline layer which remains over the emitter region as a contact with the emitter region avoids these difficulties.

Thus it will be seen that the invention provides for the reduction in the number of separate masking steps, thus reducing alignment difficulties. The use of a layer, or part thereof, positioned in a previous step to define subsequent areas provides for increased positional accuracy of the various regions. This in turn enables reduced spacing of the regions without danger of electrical shorts. The use of a polycrystalline layer as a doping source also reduces the liklihood of electrical shorts and permits easy and economic manufacture. Other advantages are also obtained as has been described and as will be appreciated from the description.

What is claimed is:

1. A method of manufacturing bipolar semiconductor devices, comprising: forming a layer of polycrystalline silicon on the surface of a substrate; masking the layer; removing part of the layer to expose said substrate in areas for eventual conversion to base-contact regions and forming an emitter region beneath the remaining portion of the layer of polycrystalline silicon, whereby the base contact regions and the emitter region are defined relative to one another by a single masking step.

2. A method as claimed in claim 1, including doping the polycrystalline silicion layer with a dopant suitable for an emitter region.

3. A method as claimed in claim 2, including heating the device to diffuse the dopant in the polycrystalline layer into the substrate to form the emitter region.

4. A method as claimed in claim 1 including: forming a layer of silicon nitride over the polycrystalline silicon layer after forming the polycrystalline layer; masking the silicon nitride layer; and etching the silicon nitride layer to expose the polycrystalline silicon layer at areas coincident with the eventual base contact regions; whereby the silicon nitride layer acts as the mask for the polycrystalline layer.

5. A method as claimed in claim 4, including: edge etching the polycrystalline layer after etching the polycrystalline layer down to the substrate, to undercut the silicon nitride layer and to define the size of the emitter region.

* * * * *